US012568810B2

(12) United States Patent
Chen et al.

(10) Patent No.:  US 12,568,810 B2
(45) Date of Patent:      Mar. 3, 2026

(54) ANTI-DIFFUSION SUBSTRATE STRUCTURE AND MANUFACTURING METHOD THEREOF

(71) Applicant: UNIMICRON TECHNOLOGY CORP., Taoyuan City (TW)

(72) Inventors: Yi Ling Chen, Taoyuan City (TW); Wei Tse Ho, Taoyuan City (TW); Chin-Sheng Wang, Taoyuan City (TW); Pu-Ju Lin, Taoyuan City (TW); Cheng-Ta Ko, Taoyuan City (TW)

(73) Assignee: UNIMICRON TECHNOLOGY CORP., Taoyuan City (TW)

( * ) Notice: Subject to any disclaimer, the term of this patent is extended or adjusted under 35 U.S.C. 154(b) by 675 days.

(21) Appl. No.: 18/088,204

(22) Filed: Dec. 23, 2022

(65) Prior Publication Data

US 2024/0167163 A1      May 23, 2024

(30) Foreign Application Priority Data

Nov. 17, 2022      (TW) .................................. 111144051

(51) Int. Cl.
| | |
|---|---|
| *H01L 23/48* | (2006.01) |
| *H01L 21/768* | (2006.01) |
| *H01L 23/522* | (2006.01) |
| *H01L 23/528* | (2006.01) |
| *H01L 23/532* | (2006.01) |
| *H01L 23/538* | (2006.01) |

(52) U.S. Cl.
CPC ...... *H01L 23/481* (2013.01); *H01L 21/76898* (2013.01); *H01L 23/5226* (2013.01); *H01L*
*23/5283* (2013.01); *H01L 23/53238* (2013.01); *H01L 23/5384* (2013.01)

(58) Field of Classification Search
CPC ............. H01L 23/5226; H01L 23/5283; H01L 23/53238; H01L 23/5384; H01L 23/481; H01L 23/49827; H05K 1/0306; H05K 1/115
See application file for complete search history.

(56) References Cited

FOREIGN PATENT DOCUMENTS

| | | |
|---|---|---|
| TW | I278967 B | 4/2007 |
| TW | 201017850 A | 5/2010 |
| TW | 201230265 A | 7/2012 |
| TW | I391523 B | 4/2013 |
| TW | 201332072 A | 8/2013 |
| TW | 202201552 A | 1/2022 |
| TW | 202245064 A | 11/2022 |
| WO | WO2017034591 A1 | 3/2017 |

*Primary Examiner* — David A Zarneke
(74) *Attorney, Agent, or Firm* — WPAT, PC

(57) ABSTRACT

An anti-diffusion substrate structure includes a substrate, a substrate circuit layer, and a chip. The substrate has multiple through holes. Within each of the through holes includes a first metal layer and an anti-diffusion layer plated on the first metal layer. The anti-diffusion layer is an Electroless Palladium Immersion Gold (EPIG) layer or an Electroless Nickel Electroless Palladium Immersion Gold (ENEPIG) layer. The substrate circuit layer is mounted on the substrate and extended on the anti-diffusion layer within each of the through holes. The substrate circuit layer is made of a second metal layer, and a composition of the second metal layer is different from a composition of the first metal layer. The chip is electrically connected to the substrate circuit layer. The anti-diffusion layer is able to better prevent material of the first metal layer from migrating or diffusing to the second metal layer.

8 Claims, 16 Drawing Sheets

ANTI-DIFFUSION SUBSTRATE STRUCTURE AND MANUFACTURING METHOD THEREOF

CROSS REFERENCE TO RELATED APPLICATIONS

The present application claims priority to Taiwan application No. 111144051, filed on Nov. 17, 2022, the content of which is hereby incorporated by reference in its entirety.

BACKGROUND OF THE INVENTION

1. Field of the Invention

The present invention relates to a substrate structure and a manufacturing method thereof, and particularly to an anti-diffusion substrate structure and a manufacturing method thereof.

2. Description of the Related Art

In the conventional circuit structure manufacturing process, mounting a chip on a substrate is not merely combining the pins of the chip with the circuits on the substrate. The problem is that some of the circuits on the substrate may be affected by the diffusion effect of other metals, which affects the quality of its electrical connection with the chip pins. When the chip is operating, the circuit on the substrate is affected by the migration or diffusion effect of other metals. The circuit on the substrate is doped with impurities of other metals, which may increase the resistance for the signal transmission, thereby damaging the quality of signal received or output by the chip.

Please refer to FIG. 11: for example, a plurality of through holes 20' are formed on a glass substrate 10' by photoetching at first in the conventional process.

Please refer to FIG. 12: a copper metal layer 30' is further formed within each of the through holes 20', and the copper metal layer 30' is arranged in a V shape in each of through holes 20'.

Please refer to FIGS. 13A and 13B: in a vacuum environment, an anti-diffusion layer 40' is plated on the glass substrate 10' by physical vapor deposition (PVD), so that the anti-diffusion layer 40' covers the glass substrate 10' and simultaneously covers the copper metal layer 30'. The anti-diffusion layer 40' practically comprises multiple layers of materials. For example, the anti-diffusion layer 40' is made of a multi-layer material of tungsten titanium (TiW)-silicon dioxide (SiO2)-tungsten titanium (TiW), or a multi-layer material of tantalum nitride (TaN)-silicon dioxide (SiO2)-tantalum nitride (TaN). In other words, the formation of the anti-diffusion layer 40' takes several vacuum coating steps. Taking a multi-layer material of tungsten titanium (TiW)-silicon dioxide (SiO2)-tungsten titanium (TiW) as an example, a first tungsten-titanium layer 41' is deposited at first, then a silicon dioxide layer 42' is deposited, and then a second tungsten-titanium layer 43' is deposited. After the coating of the anti-diffusion layer 40' is completed, a gold layer (Au) 50' can be formed on the anti-diffusion layer 40' by physical vapor deposition. Such a process of depositing the anti-diffusion layer 40' in three steps is time-consuming and complicated and hence the efficiency is not obvious.

Please also refer to FIG. 14: in addition, in this process, the coverage of the anti-diffusion layer 40' formed in the through holes with high aspect ratios (AR) by PVD is poor, so that the anti-diffusion layer 40' cannot completely cover the copper metal layer 30'. As a result, some gaps may appear between the anti-diffusion 40' and the copper metal layer 30'. This is because the PVD process cannot guarantee that the multiple layers in anti-diffusion layer 40' will be tightly stacked together. Therefore, there are probabilities of naturally forming some gaps on the stack, and further copper metal 100' of the copper metal layer 30' is prone to migration or diffusion to the gold layer 50' along the gaps. Thus, the purity of the gold layer 50' is reduced by the doping of the copper metal 100', affecting the signal transmission quality of the chip. FIGS. 13A and 13B are examples illustrating the poor coverage of two different anti-diffusions layers 40', and FIG. 14 is a partially enlarged schematic view of the example illustrated in FIG. 13A. Additionally, the gold layer 50' formed by PVD in the through holes with high aspect ratios (not shown in the figure) is also limited by the PVD process. Consequently, the coverage of the gold layer 50' in the through holes with high aspect ratios is poor, so that the gold layer 50' cannot completely cover the anti-diffusion layer 40'.

Another problem is that the anti-diffusion layer 40' deposited in each of the through holes 20' in V-shaped, which further reduces the space in which the gold layer 50' can be formed in the through holes 20'. This situation is more severe in the through holes 20' with high aspect ratios. For example, the through holes 20' with aspect ratios greater than two have less available space for the gold layer 50' to be mounted within. This makes the gold layer 50' in each of the through holes 20' unable to well cover the anti-diffusion layer 40', increasing the probability that the gold layer 50' peels off from the anti-diffusion layer 40'.

Please refer to FIG. 15: the prior art needs much more etching processes to remove the redundant anti-diffusion layer 40'. For example, the positions of each of the through holes 20' are covered by a photomask 60', and the gold layer 50' and the anti-diffusion layer 40' in the interval area between each of the through holes 20' not covered by the photomask 60' are exposed. The gold layer 50', the second tungsten titanium layer 43', the silicon dioxide layer 42', and the first tungsten-titanium layer 41' are sequentially removed through multiple etching processes. This is time-consuming and costly for the manufacturing process and hence the efficiency is not obvious.

Based on the above reasons, the conventional process of connecting chips to glass substrates still needs to be improved to help improve the yield of chips connected to glass substrates.

SUMMARY OF THE INVENTION

The present invention provides an anti-diffusion substrate structure and a manufacturing method for an anti-diffusion substrate structure.

The anti-diffusion substrate structure includes:

a substrate including a plurality of through holes; wherein a first metal layer and an anti-diffusion layer plated on the first metal layer are formed within each of the through holes, and the anti-diffusion layer is an Electroless Palladium Immersion Gold (EPIG) layer or an Electroless Nickel Electroless Palladium Immersion Gold (ENEPIG) layer;

a substrate circuit layer mounted on the substrate, and extended on the anti-diffusion layer within each of the through holes; wherein the substrate circuit layer is made of a second metal layer, and a composition of the second metal layer is different from a composition of the first metal layer; and a chip including at least one pin electrically connected to the substrate circuit layer.

The manufacturing method of the anti-diffusion substrate structure includes the following steps:

forming a plurality of through holes on a substrate;

forming a first metal layer within each of the through holes;

plating an anti-diffusion layer on the first metal layer within each of the through holes; wherein the anti-diffusion layer is an Electroless Palladium Immersion Gold (EPIG) layer or an Electroless Nickel Electroless Palladium Immersion Gold (ENEPIG) layer;

mounting a second metal layer on the substrate and the anti-diffusion layer within each of the through holes; wherein the composition of the second metal layer is different from a composition of the first metal layer;

etching the second metal layer to form a substrate circuit layer; and connecting the substrate circuit layer with at least one pin of a chip.

In an embodiment of the present invention, a metal reactivity of the first metal layer is greater than a metal reactivity of the second metal layer. And the first metal layer fills each of the through holes to form a V-shaped blind hole, a U-shaped blind hole or an H-shaped blind hole.

As the anti-diffusion layer of the present invention is plated on and covers the first metal layer, the anti-diffusion layer can be completely attached to the first metal layer when the anti-diffusion layer is formed, and is not affected by the high aspect ratio and hence avoids generating gaps. The anti-diffusion layer integrally completely attached to the first metal layer prevents the compositions of the first metal layer from diffusing into the second metal layer. Therefore, the second metal layer can maintain high purity without being polluted by the first metal layer due to diffusion. In an embodiment of the present invention, the composition of the second metal layer is gold (Au), and composition of the first metal layer is copper (Cu). By plating the Electroless Palladium Immersion Gold layer or the Electroless Nickel Electroless Palladium Immersion Gold layer on the first metal layer, the present invention can avoid forming gaps between the Electroless Palladium Immersion Gold layer and the first metal layer, or the Electroless Nickel Electroless Palladium Immersion Gold layer and the first metal layer. Moreover, because the anti-diffusion layer does not have gaps, the copper metal in the first metal layer hardly diffuses into the second metal layer. In this way, the second metal layer can maintain high metallic purity, so that a good electrical connection can be maintained when the substrate circuit layer is combined with the pins of the chip.

Additionally, in the present invention, the anti-diffusion layer mounted on the first metal layer is only an Electroless Palladium Immersion Gold layer or an Electroless Nickel Electroless Palladium Immersion Gold layer, rather than a composite layer formed by multiple physical deposition processes as in the prior art. Therefore, the present invention has more available space in each of the through holes for the second metal layer to be mounted within. In this way, the second metal layer can be better attached to the anti-diffusion layer without being easily detached from the anti-diffusion layer as in the prior art, and also in the through holes with high aspect ratio.

DETAILED DESCRIPTION OF THE INVENTION

The present invention provides an anti-diffusion substrate structure and a manufacturing method for an anti-diffusion substrate structure.

Figure 1:
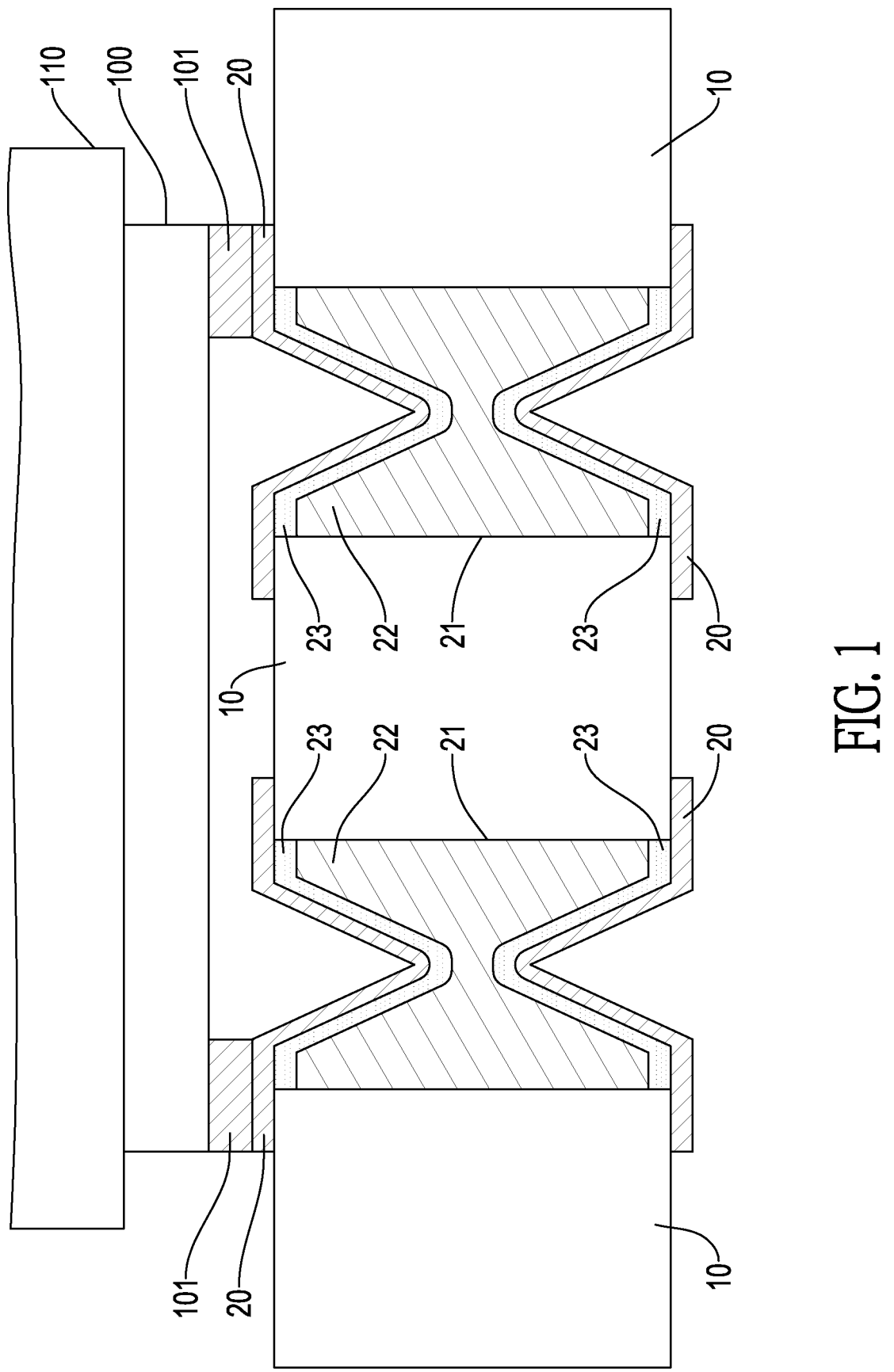
FIG. 1 is a schematic view of an anti-diffusion substrate structure of the present invention.

Please refer to FIG. 1: the anti-diffusion substrate structure of the present invention includes a substrate 10, a substrate circuit layer 20, and a chip 100. The substrate 10 has multiple through holes 21. A first metal layer 22 and an anti-diffusion layer 23 plated on the first metal layer 22 are formed within each of the through holes 21. The anti-diffusion layer 23 is an Electroless Palladium Immersion Gold (EPIG) layer or an Electroless Nickel Electroless Palladium Immersion Gold (ENEPIG) layer. Therefore, when the anti-diffusion layer 23 is plated on the first metal later 22, the anti-diffusion layer 23 can be completely attached to the first metal layer 22 without forming holes or gaps between the first metal layer 22 and the anti-diffusion layer 23.

The substrate circuit layer 20 is mounted on the substrate 10, and the substrate circuit layer 20 is extendedly mounted on the anti-diffusion layer 23 in each of the through holes 21. The substrate circuit layer 20 is made of a second metal layer, and a composition of the second metal layer is different from a composition of the first metal layer 22.

The chip 100 is mounted on another substrate, and the chip 100 has at least one pin 101. In the present invention, the at least one pin 101 of the chip 100 is electrically connected to the substrate circuit layer 20.

In an embodiment of the present invention, the metal reactivity of the first metal layer 22 is greater than the metal reactivity of the second metal layer. For example, the composition of the second metal layer is gold (Au), the composition of the first metal layer 22 is copper (Cu), and the metal reactivity of copper (Cu) is greater than the metal reactivity of gold (Au). As a result, copper (Cu) is easier to react with other substances than gold (Au). For instance, copper (Cu) is more susceptible to oxidation than gold (Au), and conductivity of copper oxide in circuits is much lower than that of pure copper and pure gold. A Microelectromechanical Systems Wafer (MEMs Wafer) 110 is further mounted on the chip 100. The at least one pin 101 of the chip 100 is electrically connected to the corresponding positions of the substrate circuit layer 20 through direct bonding of gold-to-gold. The substrate 10 is a glass substrate, and the through holes 21 are multiple Through Glass Vias (TGV). In other embodiments, the substrate 10 can also be a Printed Circuit Board (PCB) or a carrier board.

Further, the first metal layer 22 fills the through hole 21 to form a V-shaped blind hole. According to the width ratio of the V-shaped blind hole, the V-shaped blind hole formed by filling the first metal layer 22 can be a deep blind hole or a shallow blind hole. In the present embodiment shown in FIG. 1, the V-shaped blind hole formed by filling the first metal layer 22 is the deep blind hole, and in terms of high aspect ratio (AR), the high aspect ratio of the deep blind hole is greater than two. Under this condition, the substrate circuit layer 20 of the present invention can still be perfectly formed in the deep blind hole. This is because the anti-diffusion layer 23 is just the Electroless Palladium Immersion Gold (EPIG) layer or the Electroless Nickel Electroless Palladium Immersion Gold (ENEPIG) layer, rather than the multi-layer structure formed through a plurality of physical deposition processes in the prior art. Therefore, the anti-diffusion layer 23 mounted on the first metal layer 22 does not occupy too much space; in this way, the deep blind holes have enough space for the substrate circuit layer 20 to be mounted within. Moreover, since the deep blind holes have enough space for the substrate circuit layer 20 to be mounted within, the substrate circuit layer 20 formed in the deep blind hole is less likely to peel off than that of the prior art.

In the present embodiment, the substrate 10 has a front surface and a rear surface, and the deep blind holes are symmetrically formed on the front and rear surfaces of the substrate 10. In other words, the anti-diffusion 23 is formed on the first metal layer 22 that is symmetrically plated on both front and rear surfaces of the substrate 10. The substrate circuit layer 20 is formed on the anti-diffusion layer 23 on both front and rear surfaces of the substrate 10, so as to cover the blind holes formed by filling the through holes of the first metal layer 22.

Please refer to FIG. 2 to FIG. 7, the manufacturing method for an anti-diffusion substrate structure of the present invention includes the production process described below.

Figure 2:
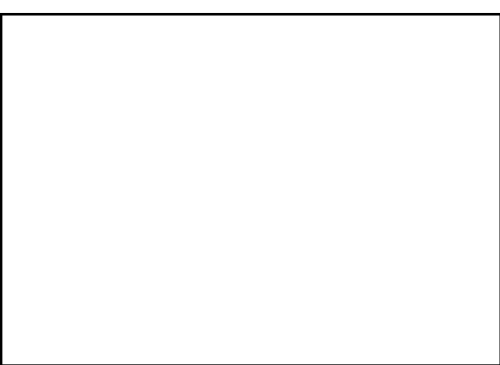
FIG. 2 to FIG. 7 are schematic views of a manufacturing method for an anti-diffusion substrate structure of the present invention.
Figure 2:
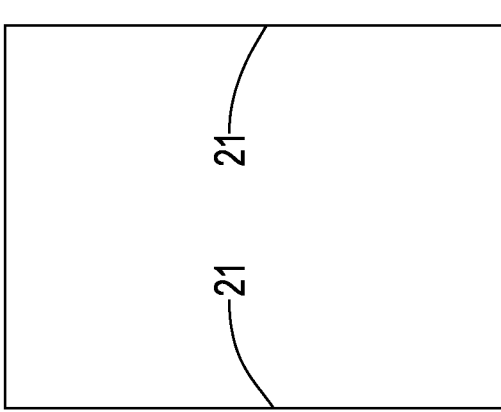
Figure 2:
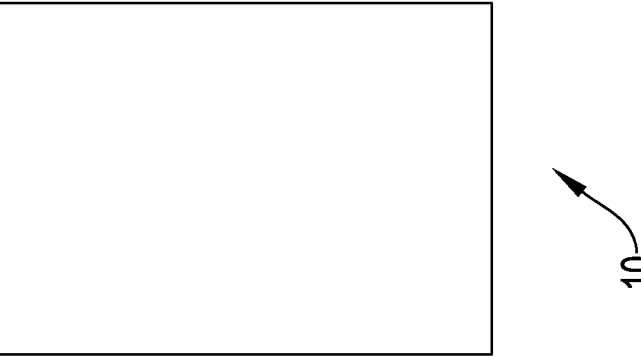

Please refer to FIG. 2: at first, this step is to form a plurality of through holes 21 on the substrate 10. For example, the through holes 21 may be formed by photo-etching through the front surface and the rear surface of the substrate 10.

Figure 3:
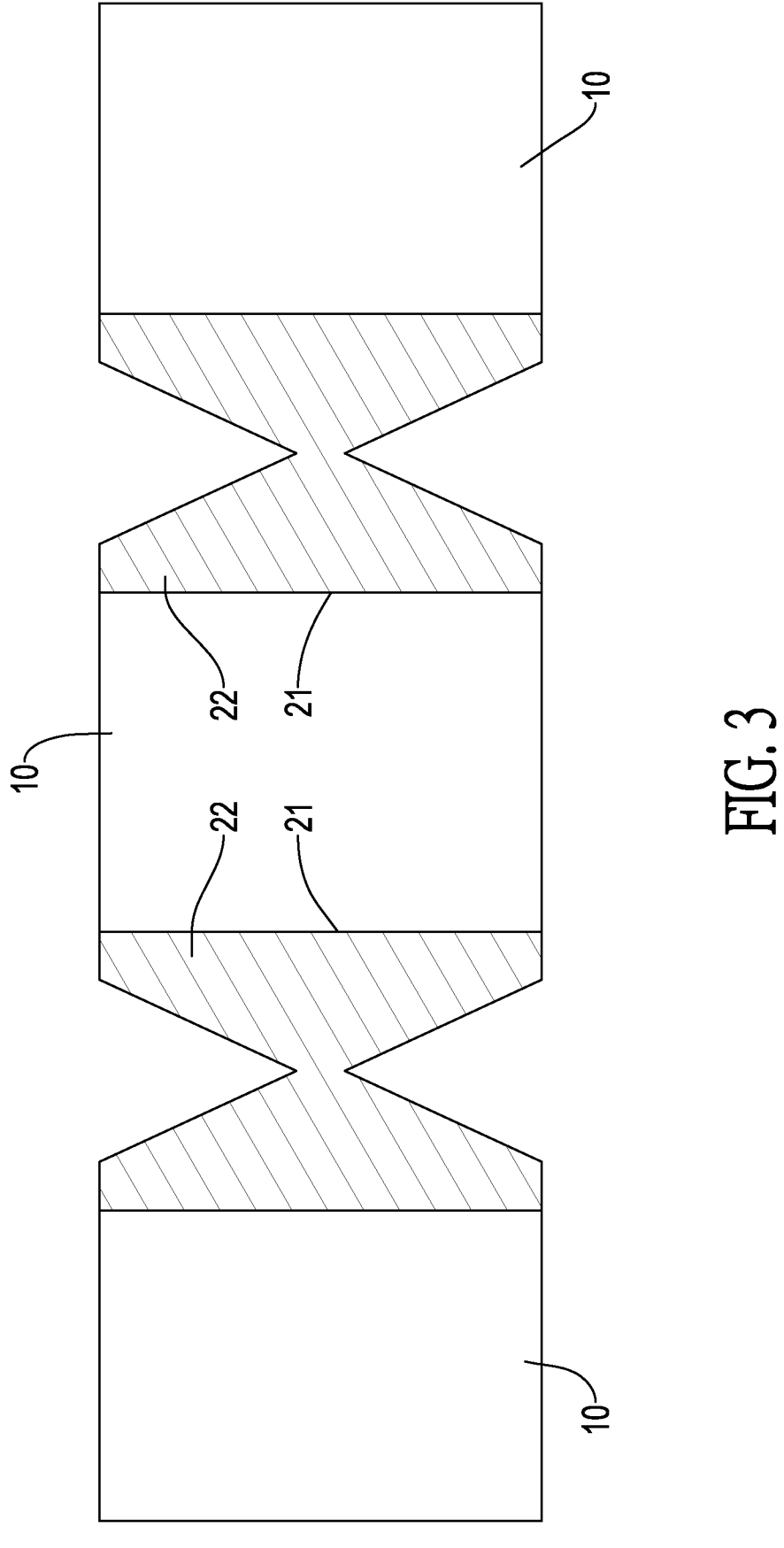

Please refer to FIG. 3: this step is to form the first metal layer 22 in each of the through holes 21. For example, each of the through holes 21 is filled by the first metal layer 22 to respectively form a V-shaped blind hole on the front and rear surfaces of the substrate 10.

Figure 4:
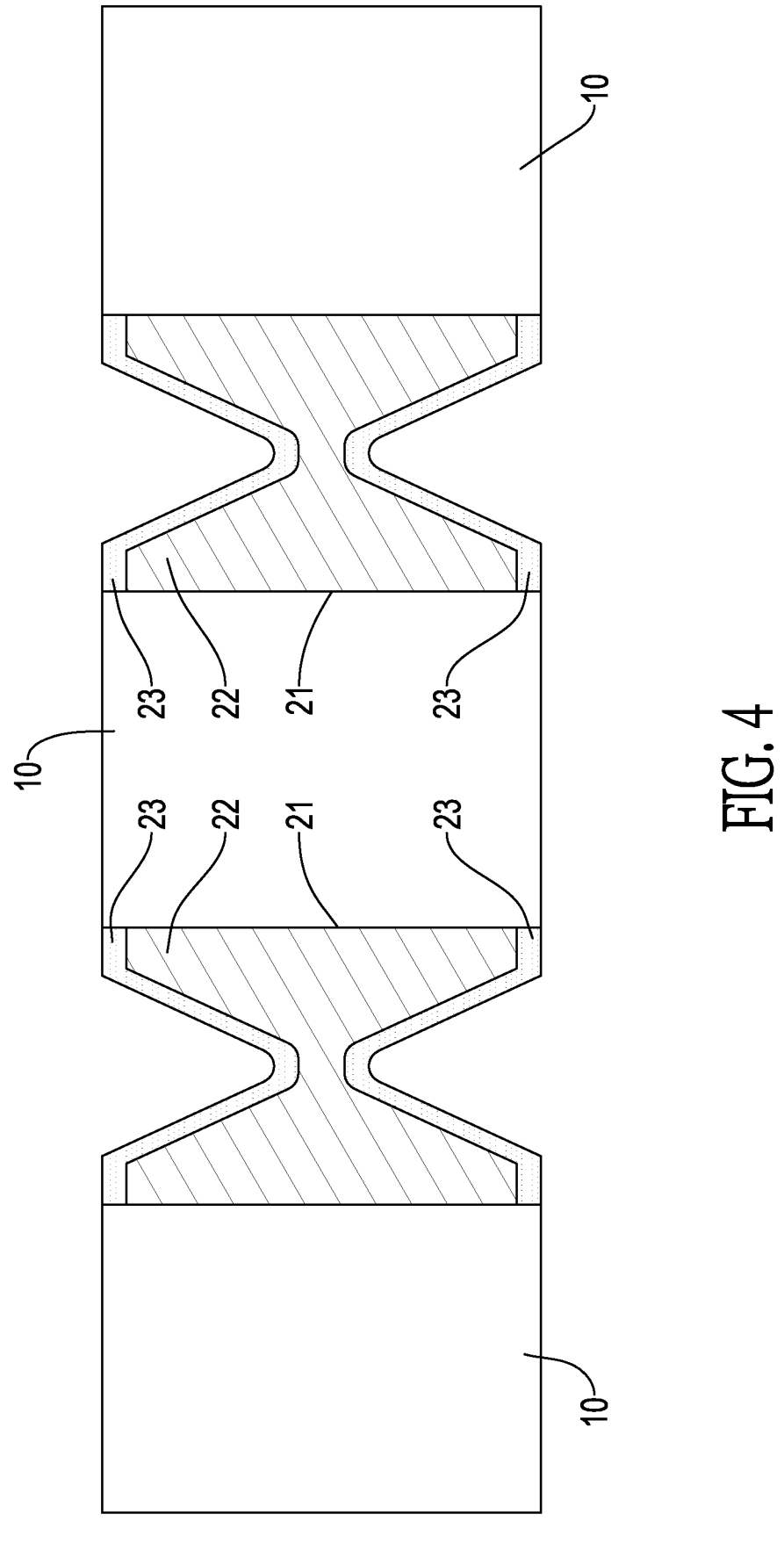

Please refer to FIG. 4: this step is to plate and cover the anti-diffusion layer 23 on the V-shaped blind hole formed by filling the first metal layer 22. The anti-diffusion layer 23 is the Electroless Palladium Immersion Gold (EPIG) layer or the Electroless Nickel Electroless Palladium Immersion Gold (ENEPIG) layer. Compared with the prior art, setting the Electroless Palladium Immersion Gold (EPIG) layer or the Electroless Nickel Electroless Palladium Immersion Gold (ENEPIG) layer as the anti-diffusion layer 23 achieves the function of blocking the diffusion of the metal composition of the first metal layer 22. Moreover, due to the principle of electroless plating, the anti-diffusion layer 23 mounted on the first metal layer 22 can make the plated metal ions adsorbed on the first metal layer 22 evenly, so that the anti-diffusion layer 23 is well plated on the first metal layer 22 with almost no gaps. In this way, the present invention can ensure that the anti-diffusion layer 23 more reliably prevents the compositions of the first metal layer 22 from diffusing into the second metal layer.

Figure 5:
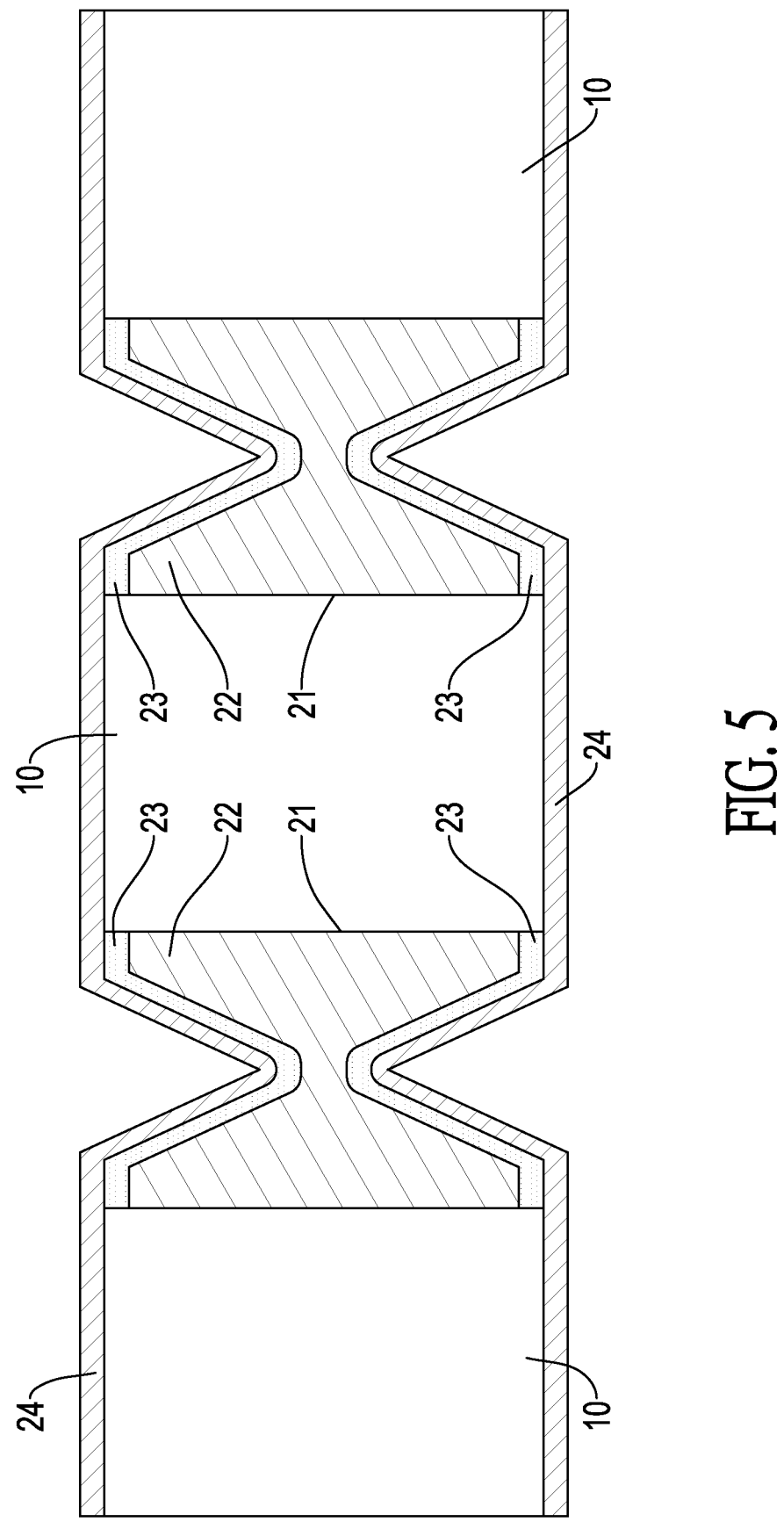

Please refer to FIG. 5: this step is to mount a second metal layer 24 on the front surface and the rear surface of the substrate 10, and the anti-diffusion layer 23. The composition of the second metal layer 24 is different from the composition of the first metal layer 22. For example, the second metal layer 24 is another metal layer with lower metal reactivity than the first metal layer 22. As mentioned in the foregoing example, the composition of the second metal later 24 is gold (Au), and the composition of the first metal layer 22 is copper (Cu). In the present embodiment, the second metal layer 24 is mounted on the anti-diffusion layer 23 through physical vapor deposition (PVD).

Figure 6:
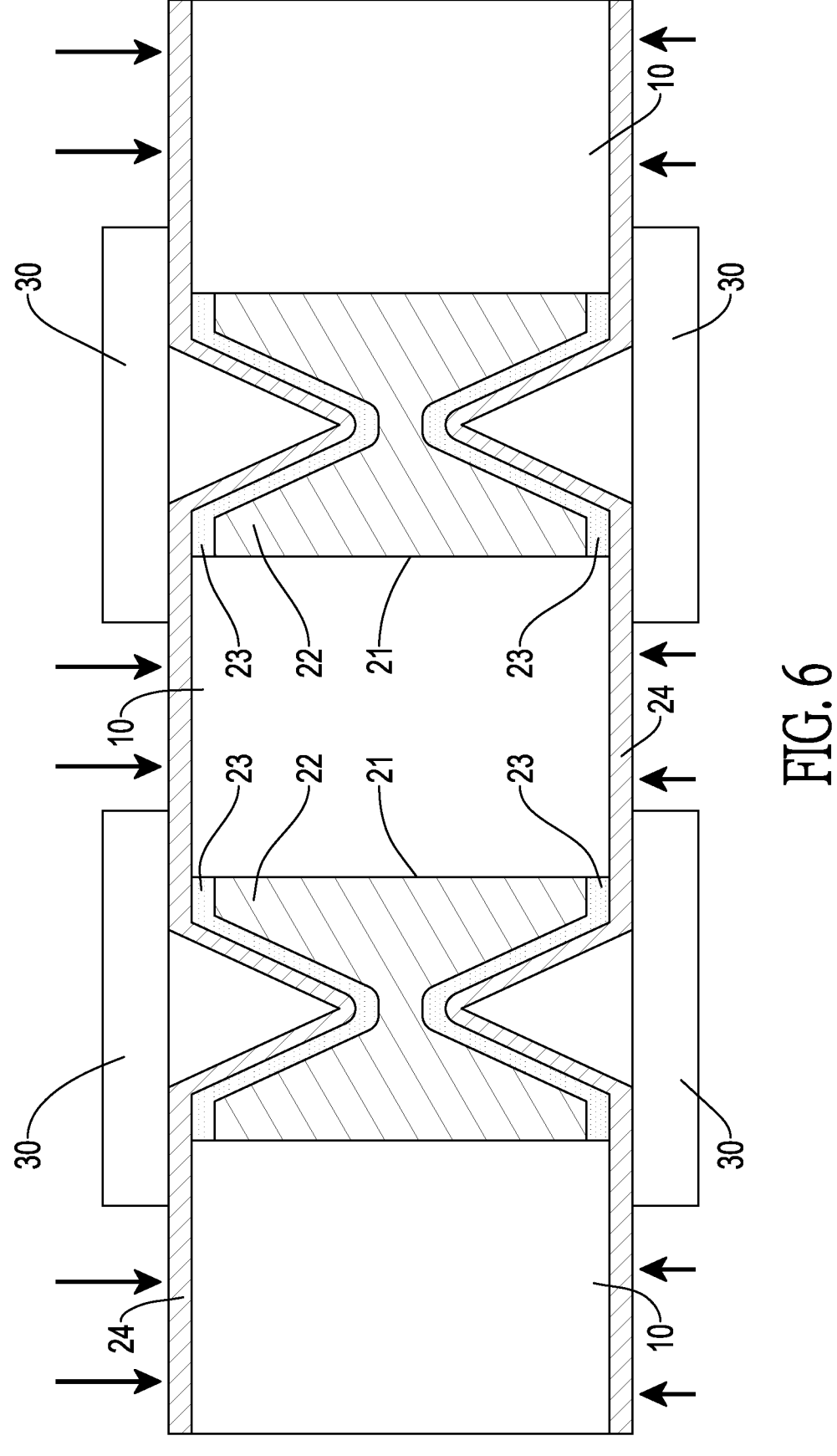

Please refer FIG. 6: this step is to etch the second metal layer 24 to form the circuit design pattern of the substrate circuit layer 20. The circuit design patterns on the front surface and the rear surface of the substrate 10 are not necessarily symmetrical. The same is that the etched second metal layer 24 will form a specific circuit pattern corresponding to each of the through holes 21. For example, two photoresist layers 30 are mounted on the front surface and the rear surface of the substrate 10 respectively. Each photoresist layer 30 covers the position of each of the through holes 21, the second metal layer 24 corresponding to the interval areas between the through holes 20 is exposed, and the exposed part of the second metal layer 24 is removed by photoetching. In this way, after the exposed part of the second metal layer 24 and the two photoresist layers 30 are removed, the remaining second metal layer 24 forms the circuit pattern of the substrate circuit layer 20. Moreover, the remaining second metal layer 24 covers each of the through holes 21.

In the steps of the present invention, it is only necessary to perform a photoetching process to pattern the second metal layer 24. Compared with the prior art, the present invention only needs to pattern the second metal layer 24 and not necessary to pattern the anti-diffusion layer 23, so that production process can be simplified. The substrate circuit layer 20 is formed with higher efficiency and lower processing cost.

Figure 7:
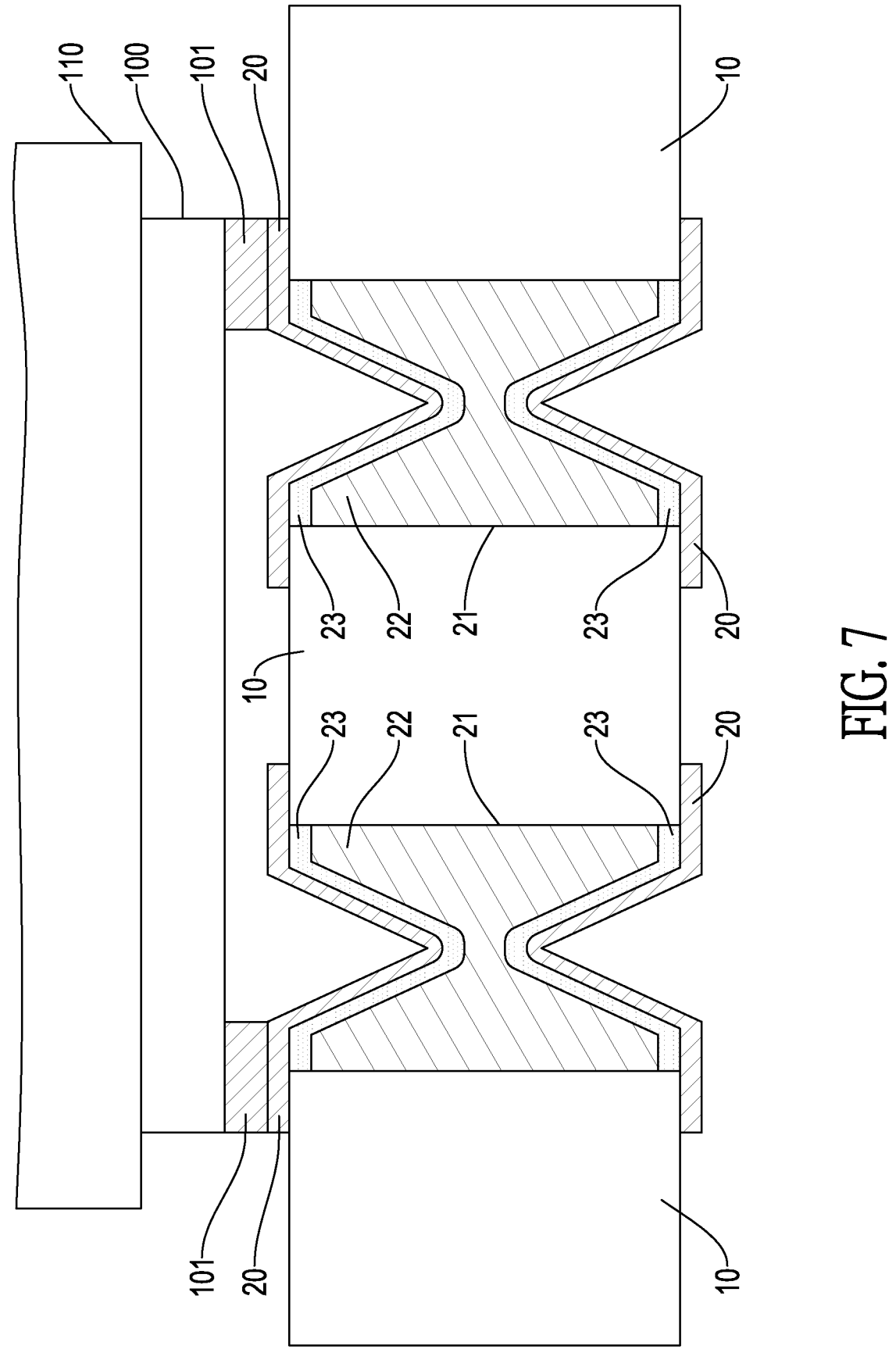

Please refer to FIG. 7: this step is to connect the substrate circuit layer 20 and the at least one pin 101 of the chip 100, so that the substrate circuit layer 20 and the at least one pin 101 form an electrical connection. In the present embodiment, the Microelectromechanical Systems Wafer (MEMs Wafer) 110 is further mounted on the chip 100, and the two pins 101 of the chips and the second metal layer 24 are made of gold (Au). As a result, the connection step described in this step is a gold-to-gold step between the substrate circuit layer 20 and the two pins 101 of the chip 100.

As the anti-diffusion layer 23 of the present invention will not be affected by the high aspect ratio to form gaps, the gold (Au) in the substrate circuit layer 20 can be reliably protected from the diffusion pollution of the copper (Cu) in the first metal layer 22. The gold (Au) in the substrate circuit layer 20 can therefore maintain high metal purity. Moreover, since the substrate circuit layer 20 and the two pins 101 of the chip 100 are high-purity metals, when the substrate circuit layer 20 and the two pins 101 of the chip 100 are combined, they will have a good electrical connection and lower impedance. Therefore, better transmission signal quality can be obtained between the substrate circuit layer 20 and the chip 100.

Figure 8:
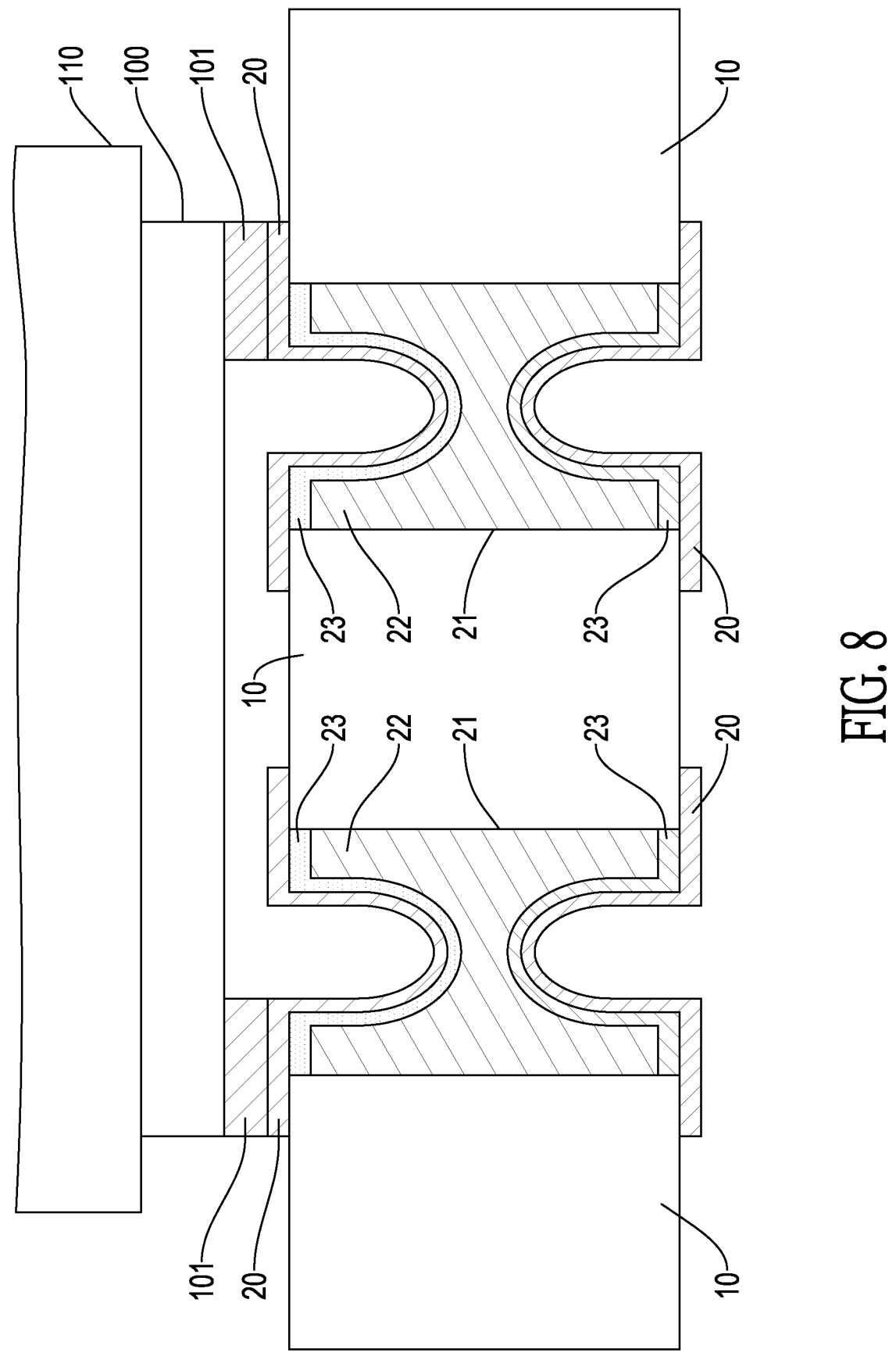
FIG. 8 is a schematic view of an embodiment of the anti-diffusion substrate structure of the present invention.

Please refer to FIG. 8: in another embodiment, the first metal layer 22 fills each of the through holes 21 to form a U-shaped blind hole. That is, the first metal layer 22, the anti-diffusion layer 23 and the substrate circuit layer 20 in the U-shaped blind hole are all U-shaped.

Figure 9:
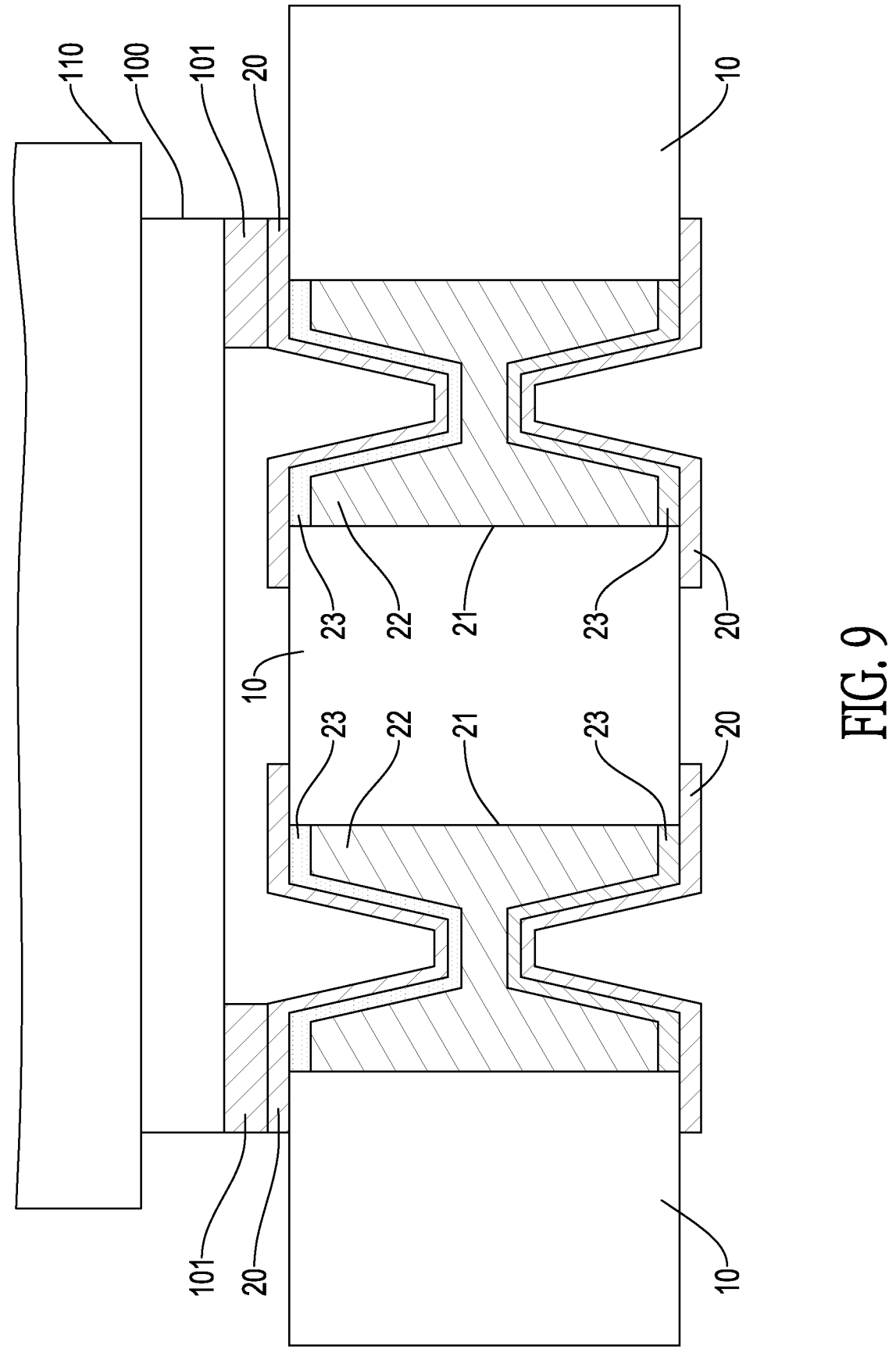
FIG. 9 is a schematic view of another embodiment of the anti-diffusion substrate structure of the present invention.

Please refer to FIG. 9: in another embodiment, the first metal layer 22 fills each of the through holes 21 to form an H-shaped blind hole. That is, the first metal layer 22, the anti-diffusion layer 23 and the substrate circuit layer 20 in the U-shaped blind hole are all H-shaped.

Figure 10:
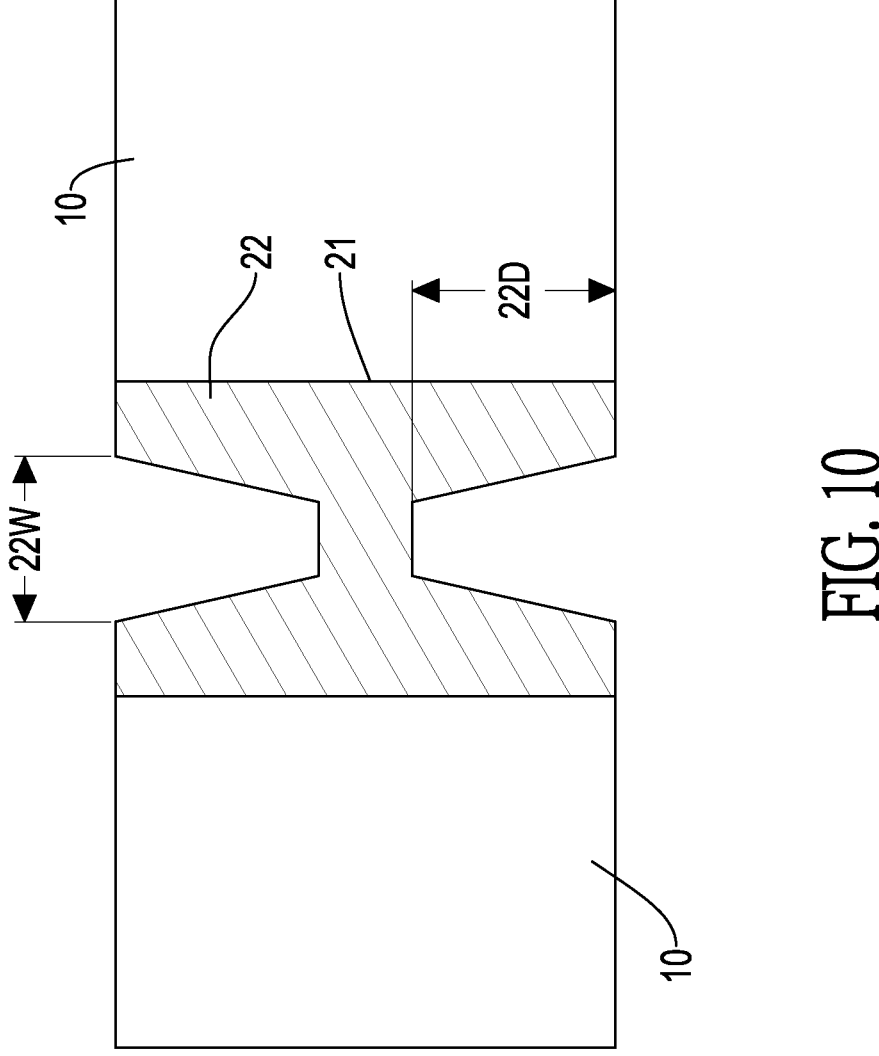
FIG. 10 is a schematic view of formation dimensions of a first metal layer in the anti-diffusion substrate structure of the present invention.
Figure 11:
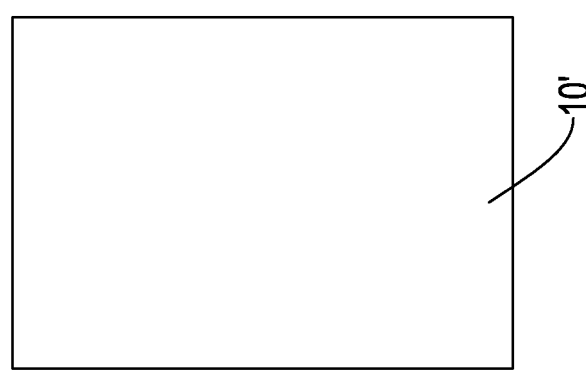
FIG. 11 to FIG. 15 are schematic views of manufacturing a conventional substrate structure.
Figure 11:
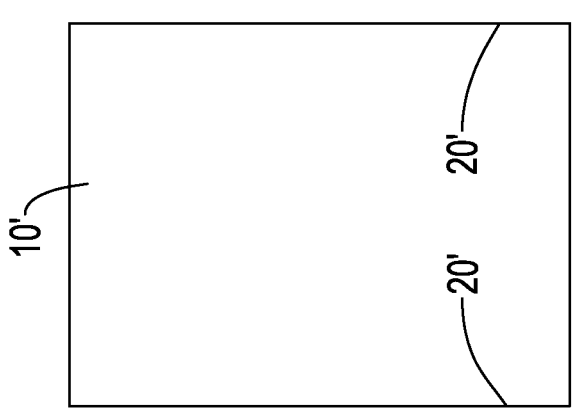
Figure 11:
Figure 11:
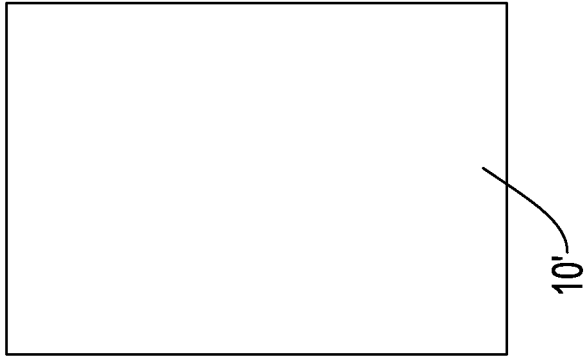
Figure 12:
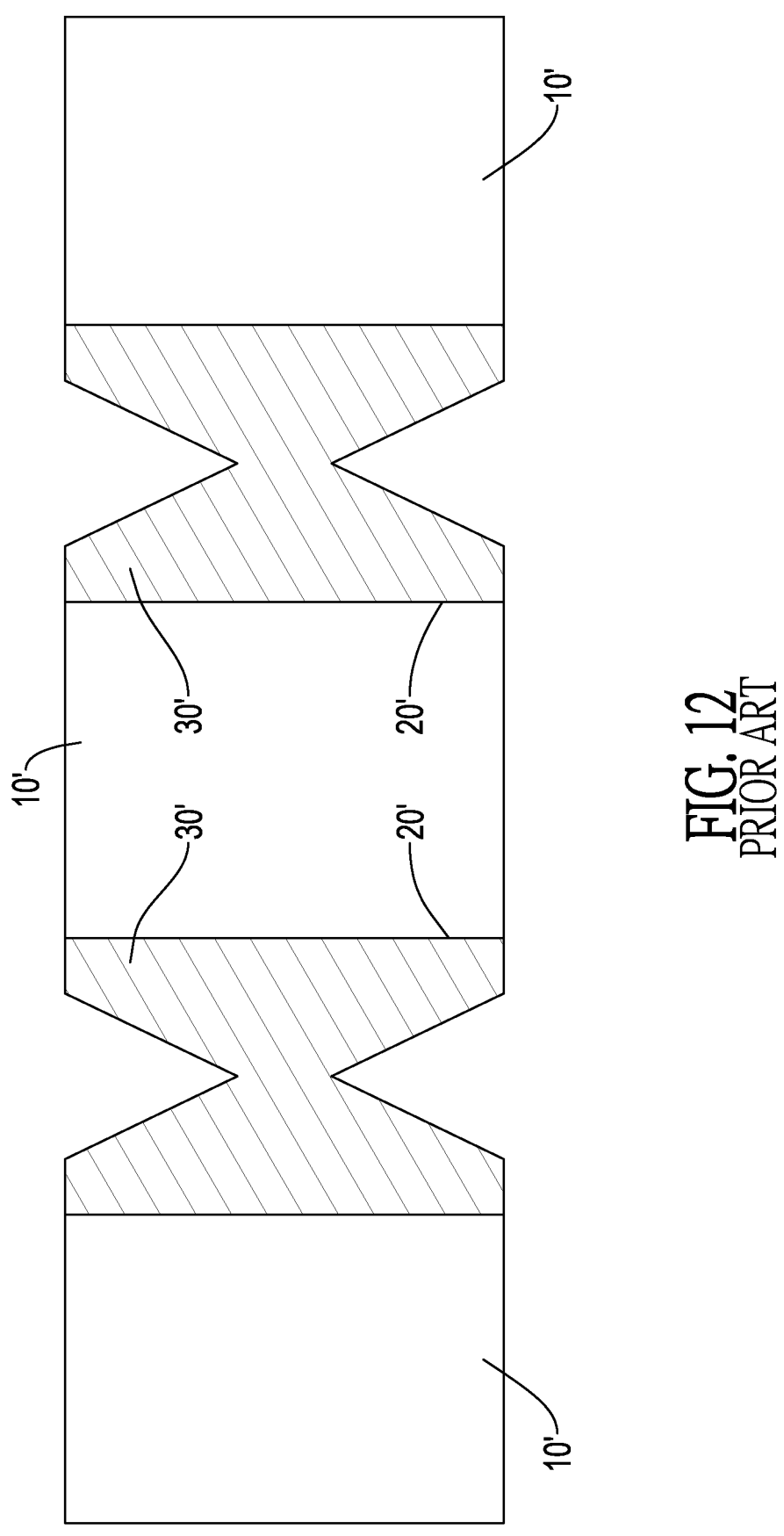
Figure 13A:
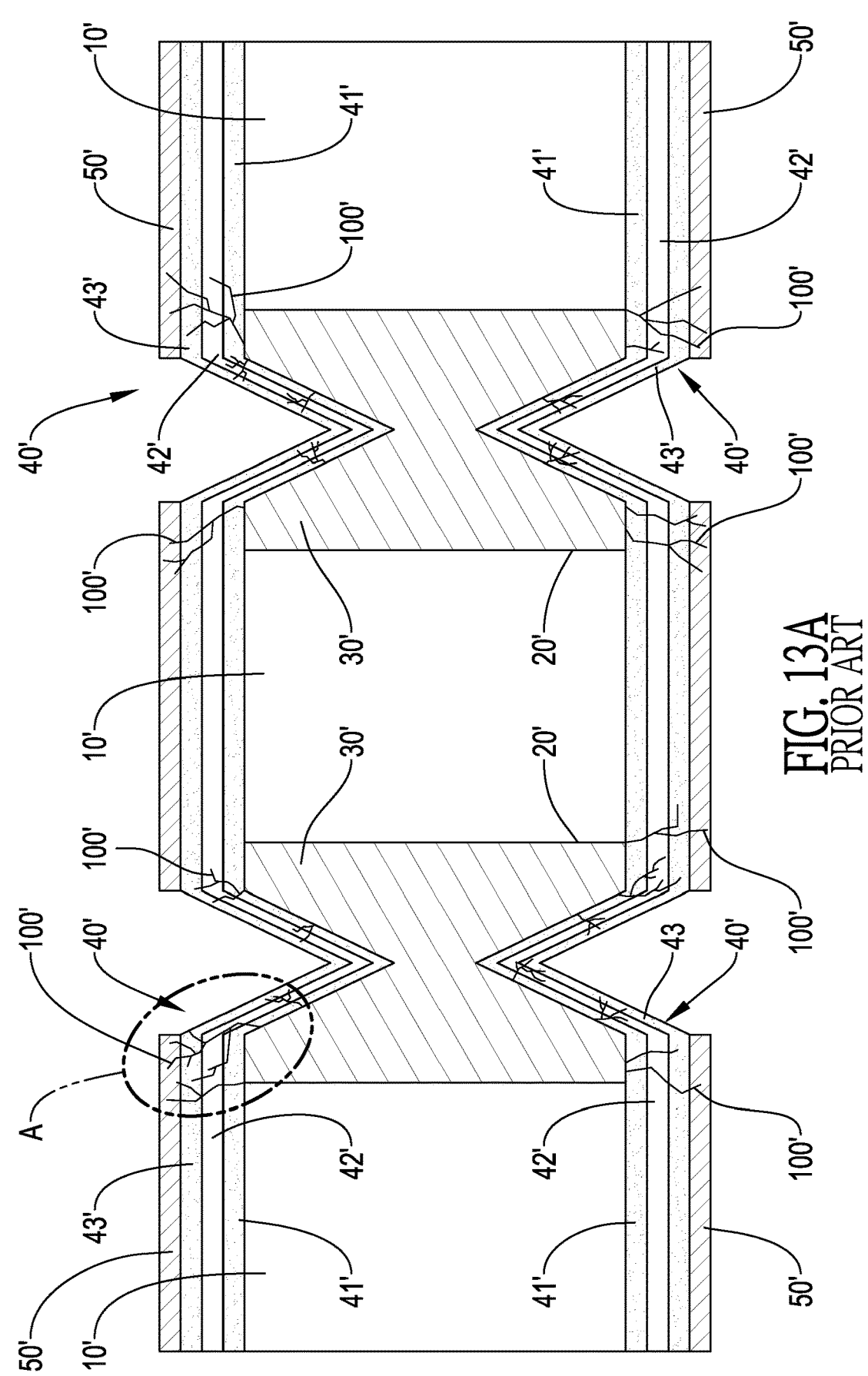
Figure 13B:
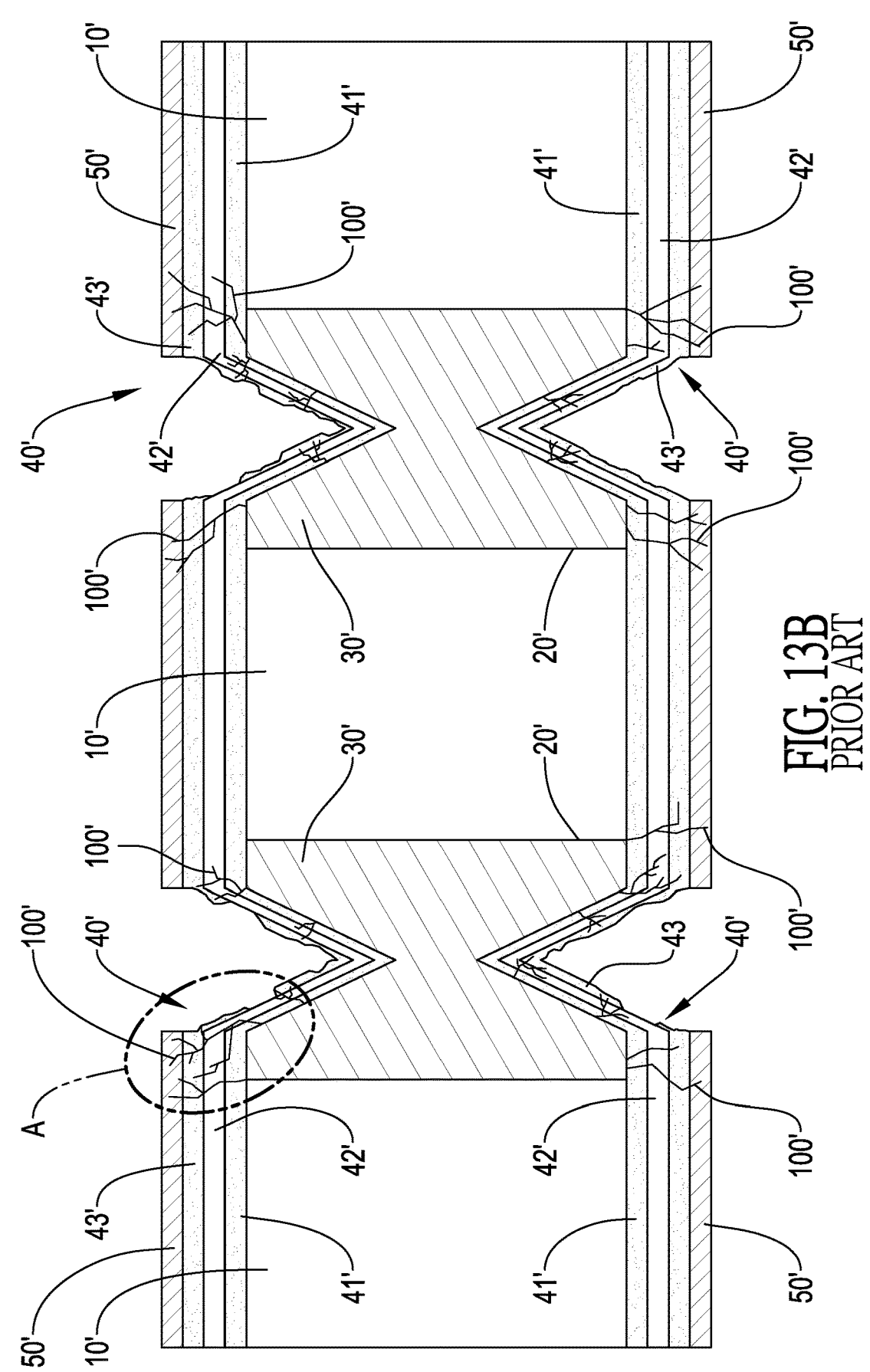
Figure 14:
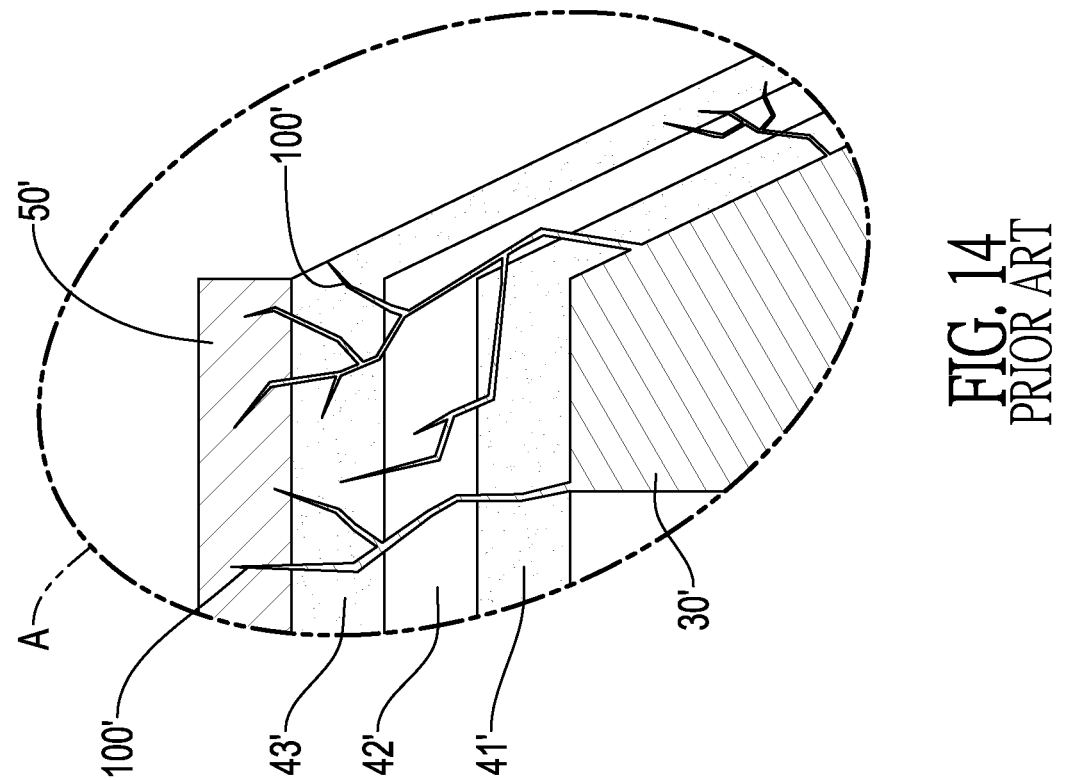
Figure 15:
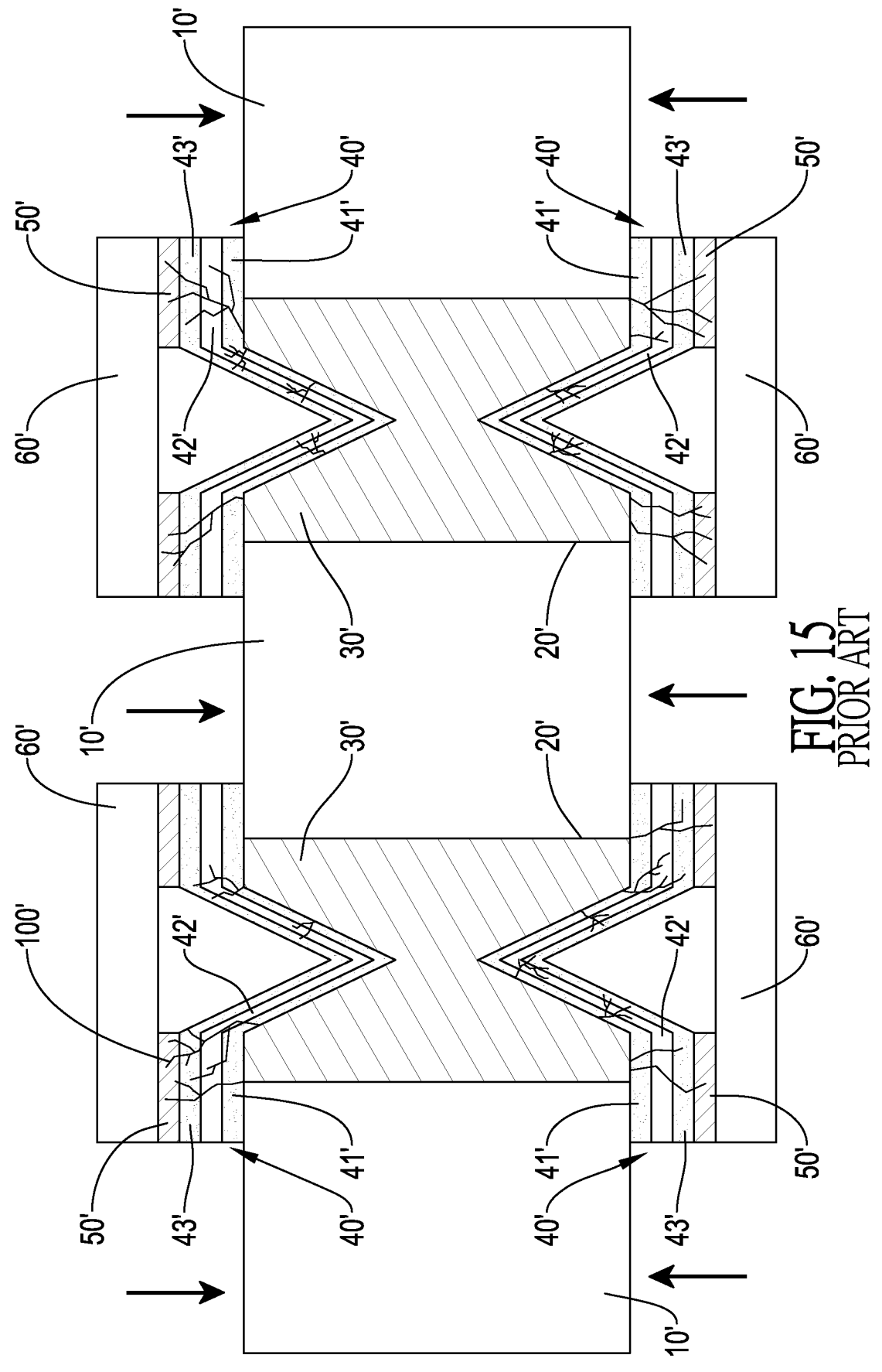

Please refer to FIG. 10: the first metal layer 22 of the H-shaped blind hole further has a vias depth 22D and a vias size 22W. The vias depth 22D defines the deepest depth of the blind hole, and the vias size 22W defines the width of the blind holes opening. For example, the opening of the H-shaped blind hole is circular, and the vias size 22D is the diameter width of the H-shaped blind holes opening. In the present embodiment, the vias depth 22D of the H-shaped first metal layer 22 is between 1 micrometer (μm) and 100 μm, and the vias size 22W is greater than 10 μm. In other embodiments, the V-shaped blind hole and U-shaped blind hole also have their own vias depth specifications and vias size specifications respectively to define the depth and width of various blind holes types respectively.

The above content is only an exemplary disclosure of several embodiments of the present invention for reference, and is not intended to limit other feasible implementations of the present invention. Those with ordinary knowledge in the technical field can refer to this application to modify the technical details, but all the content described in the specification will be protected by the claims of this application.

What is claimed is:

1. An anti-diffusion substrate structure, including:
   a substrate, including a plurality of through holes; wherein a first metal layer and an anti-diffusion layer plated on the first metal layer are formed within each of the through holes, and the anti-diffusion layer is an Electroless Palladium Immersion Gold (EPIG) layer or an Electroless Nickel Electroless Palladium Immersion Gold (ENEPIG) layer;
   a substrate circuit layer, mounted on the substrate, and extended on the anti-diffusion layer within each of the through holes; wherein the substrate circuit layer is made of a second metal layer, and a composition of the second metal layer is different from a composition of the first metal layer; and
   a chip, including at least one pin electrically connected to the substrate circuit layer.

2. The anti-diffusion substrate structure as claimed in claim 1, wherein: a metal reactivity of the first metal layer is greater than a metal reactivity of the second metal layer.

3. The anti-diffusion substrate structure as claimed in claim 2, wherein: the composition of the first metal layer is copper, and the composition of the second metal layer is gold.

4. The anti-diffusion substrate structure as claimed in claim 1, wherein: the first metal layer fills each of the through holes to form a V-shaped blind hole, a U-shaped blind hole, or an H-shaped blind hole.

5. A manufacturing method of an anti-diffusion substrate structure, including steps as follows:
   forming a plurality of through holes on a substrate;
   forming a first metal layer within each of the through holes;
   plating an anti-diffusion layer on the first metal layer within each of the through holes; wherein the anti-diffusion layer is an Electroless Palladium Immersion Gold (EPIG) layer or an Electroless Nickel Electroless Palladium Immersion Gold (ENEPIG) layer;
   mounting a second metal layer on the substrate and the anti-diffusion layer within each of the through holes; wherein a composition of the second metal layer is different from a composition of the first metal layer;
   etching the second metal layer to form a substrate circuit layer; and
   connecting the substrate circuit layer with at least one pin of a chip.

6. The manufacturing method as claimed in claim 5, wherein: a metal reactivity of the first metal layer is greater than a metal reactivity of the second metal layer.

7. The manufacturing method as claimed in claim 6, wherein: the composition of the first metal layer is copper, and the composition of the second metal layer is gold.

8. The manufacturing method as claimed in claim 5, wherein: the first metal layer fills each of the through holes to form a V-shaped blind hole, a U-shaped blind hole or an H-shaped blind hole.

* * * * *